US009234085B2

(12) United States Patent
Sun et al.

(10) Patent No.: US 9,234,085 B2
(45) Date of Patent: Jan. 12, 2016

(54) POLYIMIDE FILM AND POLYIMIDE LAMINATE THEREOF

(71) Applicant: MORTECH CORPORATION, Pingzhen, Taoyuan County (TW)

(72) Inventors: Der-Jen Sun, Pingzhen (TW); Yen-Huey Hsu, Pingzhen (TW); Kuo-Wei Li, Pingzhen (TW)

(73) Assignee: MORTECH CORPORATION, Pingzhen (TW)

( * ) Notice: Subject to any disclaimer, the term of this patent is extended or adjusted under 35 U.S.C. 154(b) by 302 days.

(21) Appl. No.: 13/875,167

(22) Filed: May 1, 2013

(65) Prior Publication Data

US 2014/0205824 A1 Jul. 24, 2014

(30) Foreign Application Priority Data

Jan. 23, 2013 (TW) ............................ 102102538 A

(51) Int. Cl.

| | |
|---|---|
| ***B32B 27/00*** | (2006.01) |
| ***C08K 3/32*** | (2006.01) |
| ***C08J 5/18*** | (2006.01) |

(52) U.S. Cl.

CPC . *C08K 3/32* (2013.01); *B32B 27/00* (2013.01); *C08J 5/18* (2013.01); *C08J 2379/08* (2013.01); *C08K 2003/324* (2013.01); *Y10T 428/31681* (2015.04)

(58) Field of Classification Search

CPC .. B32B 27/00; C08K 3/32; Y10T 428/31681; C08J 2379/08; C08J 5/18

USPC ........................................................ 428/212

See application file for complete search history.

(56) References Cited

U.S. PATENT DOCUMENTS

| | | | | |
|---|---|---|---|---|
| 5,112,694 | A * | 5/1992 | Konotsune et al. | 428/457 |
| 2004/0142191 | A1 | 7/2004 | Mei-Yen et al. | |
| 2007/0184352 | A1 * | 8/2007 | Donoue et al. | 429/338 |
| 2010/0290797 | A1 * | 11/2010 | Mestha et al. | 399/38 |
| 2011/0217588 | A1 * | 9/2011 | Roh et al. | 429/163 |
| 2012/0214063 | A1 * | 8/2012 | Morimoto et al. | 429/211 |

FOREIGN PATENT DOCUMENTS

| | | | |
|---|---|---|---|
| TW | I321517 | B1 | 3/2010 |
| TW | 201132714 | A1 | 10/2011 |
| TW | 201232893 | A1 | 8/2012 |

* cited by examiner

*Primary Examiner* — Aaron Austin
*Assistant Examiner* — Lawrence Ferguson
(74) *Attorney, Agent, or Firm* — Maschoff Brennan

(57) ABSTRACT

A polyimide film comprising a polyimide and a lithium iron phosphate and a polyimide laminate thereof are disclosed. The weight percentage of the lithium iron phosphate is between 1 wt % and 49 wt %, and the weight percentage of the lithium iron phosphate is based on the total weight of the polyimide film. The polyimide laminate comprises a substrate and a polyimide film. The polyimide film covers the substrate.

26 Claims, 3 Drawing Sheets

POLYIMIDE FILM AND POLYIMIDE LAMINATE THEREOF

CROSS-REFERENCE TO RELATED APPLICATIONS

This non-provisional application claims priority under 35 U.S.C. §119(a) on Patent Application No(s). 102102538 filed in Taiwan, R.O.C. on Jan. 23, 2013, the entire contents of which are hereby incorporated by reference.

TECHNICAL FIELD

The disclosure relates to a polyimide film, and more particularly, to a polyimide film comprising lithium iron phosphate and a polyimide laminate thereof.

BACKGROUND

Polyimide (PI) is a macromolecular material including strong mechanical properties, heat endurance under high temperature, and electric insulating properties. Now, polyimide has become an important material for manufacturing flexible printed circuits (FPC). For instance, when the manufacturers manufacturing the flexible printed circuits, circuit diagrams are designed onto the flexible copper clad laminates (FCCL), and then the circuit diagrams are covered by the polyimide films including adhesives so as to manufacture the flexible copper clad laminates covered with the polyimide films. Since printed circuit boards are important components in fields of electronic products, polyimide films have become necessary materials for manufacturing electronic products.

Since the great competence of the consuming of electronic products in daily lives, consumers have more demands on the appearance or color of the electronic products. While black color has become a fashion of mobile phones and notebooks, electronic products having a black appearance have become a symbol of fashion. On the other hand, the designs of electronic products have become more complicated with the development of technologies. Since the quality of the electronic products depends on the circuit diagrams on the printed circuit boards, the circuit diagrams have become the core technique that need to be protected. For the flexible copper clad laminates covered with the polyimide films, the polyimide films on the copper clad laminates are usually yellow, the derivative colors, or other colors with high transparency. Therefore, circuit designs on the cable layer on printed circuit boards are easily decoded or plagiarized because the transparency of the flexible copper clad laminates covered with the polyimide films. Moreover, the market of the products and the running of the companies are affected.

Therefore, now designers need to solve the problems met in the previous polyimide films that the circuit diagrams are easily decoded according to the transparency of the polyimide films.

SUMMARY

According to an embodiment, a polyimide film comprising a polyimide and a lithium iron phosphate is disclosed. The weight percentage of the lithium iron phosphate is between 1 wt % and 49 wt %, and the weight percentage of the lithium iron phosphate is based on the total weight of the polyimide film.

According to another embodiment, a polyimide laminate comprising a substrate and a polyimide film is disclosed. The polyimide film covers the substrate.

BRIEF DESCRIPTION OF THE DRAWINGS

The disclosure will become more fully understood from the detailed description given herein below for illustration only, thus does not limit the disclosure, and wherein.

DETAILED DESCRIPTION

Figure 1:
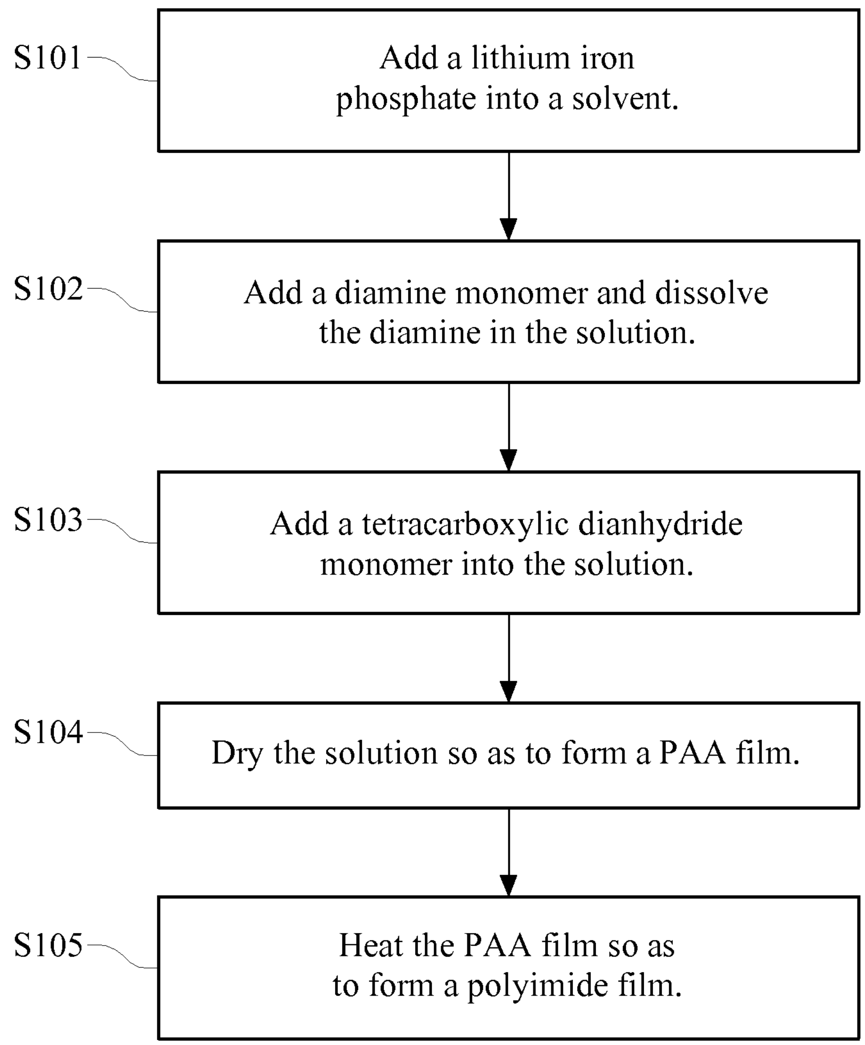
FIG. 1 is a flow chart of a method for manufacturing a polyimide film according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

First, please refer to FIG. 1. FIG. 1 is a flow chart of a method for manufacturing a polyimide film according to an embodiment of the disclosure.

First, add a lithium iron phosphate ($LiFePO_4$, LFP) into a solvent (S101). Then, a colloidal dispersion is formed by stirring the solution or a grinding process. Wherein, the solvent is, for example, N,N-dimethyl formamide (DMF), dimethylacetamide (DMAc), dimethyl sulfoxide (DMSO), N-methyl-2-pyrrolidone (NMP), γ-butyrolactone (DBL), or the derivatives, but the disclosure is not limited thereto.

In this embodiment, the weight percentage of the lithium iron phosphate is between 1 wt % and 49 wt %, and the weight percentage of the lithium iron phosphate is based on the total weight of the polyimide film. In some other embodiments, the weight percentage of the lithium iron phosphate is between 5 wt % and 35 wt %. In some other embodiments, the weight percentage of the lithium iron phosphate is between 10 wt % and 30 wt %. When the weight percentage of the lithium iron phosphate is greater than 49 wt %, the dispersion of the lithium iron phosphate in the polyimide film manufactured is not uniform because the proportion of the lithium iron phosphate in the solution is too high. Therefore, the quality of the polyimide film manufactured is lowered. However, when the weight percentage of the lithium iron phosphate is less than 1 wt %, the color of the polyimide film manufactured is not black. Also, the transparency of the polyimide film manufactured is too high that the difference between the polyimide film manufactured and the pure polyimide film is not significant. Therefore, the polyimide film manufactured is not able to be used for protecting the designs of the circuits.

In this embodiment, the diameter of the lithium iron phosphate is between 0.1 micrometer and 10 micrometers. In some other embodiments, the diameter of the lithium iron phosphate is between 0.5 micrometer and 6 micrometers. In detail, when the diameter of the lithium iron phosphate is greater than 10 micrometers, the lithium iron phosphate is too large so that the surface of the manufactured polyimide film becomes too rough. Therefore, the manufactured polyimide film is not appropriate for manufacturing electronic products, such as printed circuit boards. On the other hand, when the diameter of the lithium iron phosphate is less than 0.1 micrometer, the lithium iron phosphate easily aggregates so that the dispersion of the lithium iron phosphate in the manufactured polyimide film is not uniform. Also, the smaller the diameters of the lithium iron phosphate are, the harder the manufacturing of the polyimide film becomes.

Furthermore, in this and some other embodiments, a carbon material or an inorganic particle is further added into the solution, so that the manufactured polyimide film is blacker, the light shielding ability of the manufactured polyimide film is enhanced, or physical properties of the manufactured polyimide film are enhanced. For example, the hardness, the modules, and the dimensional stability of the manufactured polyimide film are increased, and the thermal expansion coefficient of the manufactured polyimide film is decreased.

The carbon material comprises the products completely combusted or incompletely combusted from the petroleums, the charcols, or other organic compounds. For instance, the carbon material is carbon soot, carbon ash, graphite, carbon capsule, carbon nanotube, graphene, or the combination thereof, but the disclosure is not limited thereto. By adding the carbon material into the solution, the polyimide film manufactured is blacker, so that the protection of the circuit diagrams by the polyimide film from being decoded or being plagiarized is improved. On the other hand, the inorganic particle is, for example, mica powder, silicon dioxide powder, talc powder, ceramic powder, clay powder, titanium dioxide, kaolinite, sintered silica gel powder, silicon carbide, barium sulfate, boron nitride, aluminum oxide, aluminum nitride, or the combination thereof. By adding the inorganic particle into the solution, the transparency and the glossiness of the manufactured polyimide film are further decreased, so that the protection of the circuit diagrams by the polyimide film from being decoded or being plagiarized is improved.

In order to mix the lithium iron phosphate, the carbon material, and the inorganic particle in the solution more uniformly, as well as shorten the time for mixing the lithium iron phosphate, the carbon material, and the inorganic particle, the solution is mixed with the frequency between 20 Hertz (Hz) and 100 Hz. In some other embodiments, the lithium iron phosphate, the carbon material, and the inorganic particle are grinded so as to increase the rate of the carbon material, and the inorganic particle being dispersed in the solution.

Then, add a diamine monomer and dissolve the diamine in the solution (S102). Wherein, the diamine monomer is, for example, 1,4-diamino benzene, 1,3-diamino benzene, 4,4'-oxydianiline, 3,4'-oxydianiline, 4,4'-methylene dianiline, N,N-diphenylethylenediamine, diaminobenzophenone, diamino diphenyl sulfone, 1,5-naphthalene diamine, 4,4-diamino diphenyl sulfide, 1,3-bis(3-aminophenoxy)benzene, 1,4-bis(4-aminophenoxy)benzene, 1,3-bis(4-aminophenoxy)benzene, 2,2-bis [4-(4-aminophenoxy)phenyl]propane, 4,4'-bis-(4-aminophenoxy)biphenyl, 4,4'-bis-(3-aminophenoxy)biphenyl, 1,3-bis(3-aminopropyl)-1,1,3,3-tetramethyldisiloxane, 1,3-bis(3-aminopropyl)-1,1,3,3-tetraphenyldisiloxane, 1,3-bis(aminopropyl)-dimethyldiphenyldisiloxane, or the combination thereof.

Afterwards, add a tetracarboxylic dianhydride monomer into the solution (S103), so that the tetracarboxylic dianhydride monomer and the diamine monomer undergo a polymerization so as to form a polyamic acid. Wherein, the tetracarboxylic dianhydride monomer is, for instance, 1,2,4,5-benzene tetracarboxylic dianhydride, 3,3',4,4'-biphenyl tetracarboxylic dianhydride, 4,4'-oxydiphthalic anhydride, benzophenonetetracarboxylic dianhydride, (3,3',4,4'-diphenyl sulfonetetracarboxylic dianhydride, 1,2,5,6-naphthalene tetracarboxylic dianhydride, naphthalenetetracarboxylic dianhydride, bis(3,4-dicarboxyphenyl)dimethylsilane dianhydride, 1,3-bis(4'-phthalic anhydride)-tetramethyldisiloxane, or the combination thereof.

Therefore, the solution comprises the polyamic acid (PAA), the lithium iron phosphate, the carbon material, and the inorganic particle. Wherein, the viscosity of the solution is between 100 poise (ps) and 1000 ps (that is, between 10,000 cps and 100,000 cps).

Then, dry the solution so as to form a PAA film (S104). In detail, the solution is placed under a high temperature so that the solvent in the solution is vaporized from the solution because of the high temperature, as well as other components remained in the solution without being vaporized form the PAA film. Wherein, the drying temperature is, for example, corresponding to the boiling temperature of the solvent. In the embodiment, the drying temperature is between 120° C. and 200° C. but the disclosure is not limited thereto.

Finally, heat the PAA film so as to form a polyimide film (S105). In detail, the PAA film is placed under a high temperature so that the PAA film undergoes imidization so as to form the polyimide film. The manufactured polyimide film is, for instance, a bare film or being disposed on other substrates according to the users' needs. Wherein, the higher the reaction temperature is, the shorter the reaction time for manufacturing the polyimide film needs. However, when the reaction temperature is too high, the bonding between the atoms in the polyimide film is broken, so that the polyimide film degrades because of the high temperature. In this embodiment, the reaction temperature is between 270° C. and 400° C., but the disclosure is not limited thereto. Moreover, the thickness of the polyimide film is adjusted according to the users' needs. In this embodiment, the thickness of the polyimide film is greater than the diameter of the lithium iron phosphate. In this embodiment, the thickness of the polyimide film is between 12 micrometers and 250 micrometers, but the disclosure is not limited thereto.

In the following paragraphs, embodiment 1 to embodiment 6, and comparative examples 1 and 2 are presented for further descriptions. Please refer to table 1, compositions and results of corresponding analysis of the manufactured polyimide films according to FIG. 1 are presented in Table 1. The thickness of the polyimide films presented are 50 μm, but the thickness of the polyimide films are not limited to the disclosure.

TABLE 1

| Embodiment | 1 | 2 | 3 | 4 | 5 | 6 |
|---|---|---|---|---|---|---|
| polyamic acid (wt, %) | 75% | 70% | 65% | 70% | 65% | 90% |
| lithium iron phosphate (wt, %) | 25% | 20% | 20% | 20% | 35% | 5% |
| inorganic particle (wt, %) | 0 | kaolinite 10% | silicon dioxide 10% | titanium dioxide 10% | 0 | 0 |
| carbon material (wt, %) | 0 | 0 | carbon soot 5% | 0 | 0 | 5% |
| thickness of the polyimide film(μm) | 50 | 50 | 50 | 50 | 50 | 50 |
| color | Black | Black | Black | Black | Black | Black |
| surface resistance (Ω) | $\geq 10^{13}$ | $\geq 10^{13}$ | $\geq 10^{13}$ | $\geq 10^{13}$ | $\geq 10^{13}$ | $\geq 10^{13}$ |
| volume resistance (Ω cm) | $\geq 10^{13}$ | $\geq 10^{13}$ | $\geq 10^{13}$ | $\geq 10^{13}$ | $\geq 10^{13}$ | $\geq 10^{13}$ |

TABLE 1-continued

| Embodiment | 1 | 2 | 3 | 4 | 5 | 6 |
|---|---|---|---|---|---|---|
| withstanding voltage (kV/mil) | 2.0 | 3.0 | 1.2 | 3.0 | 1.5 | 1.2 |
| transmittance (%) | 20 | 10 | 0 | 0 | 0 | 0 |
| 60° glossiness (GU) | 40 | 25 | 20 | 25 | 30 | 70 |

For embodiment 1 to embodiment 6, all the manufactured polyimide films are black. Therefore, the polyimide films are suitable to be adapted for manufacturing printed circuit boards so as to protect the circuit diagrams. For embodiment 1 to embodiment 6, the surface resistance of the polyimide films manufactured is greater than or equal to $10^{13}\Omega$, the volume resistance of the polyimide films manufactured is greater than or equal to $10^{13}\Omega$, so that the polyimide films have better electric insulating properties. For the withstanding voltage of the polyimide films, the withstanding voltages of embodiment 1 to embodiment 6 are greater than or equal to 1.2 kV/mil. In other words, the polyimide films can afford a voltage higher than 1.2 kV/mil without being crumbled. Moreover, as for printed circuit boards with high frequency circuits, the manipulating conditions are usually greater than 0.2 kV/mil. Therefore, the polyimide films added with lithium iron phosphate are able to afford the manipulating conditions without being crumbled because of a high withstanding voltage. For embodiments 1, 2, 4, and 5, the withstanding voltage is greater than or equal to 1.5 kV/mil. For embodiments 1, 2, and 4, the withstanding voltage is greater than or equal to 2.0 kV/mil. For embodiment 2 and embodiment 4, the withstanding voltage is greater than or equal to 3.0 kV/mil. For the transmittance of the polyimide films, the transmittance of embodiments 1 to 6 is less than or equal to 20%, so that the polyimide films are able to shield the light. For embodiment 2 to embodiment 6, the transmittance is less than or equal to 10%. For embodiment 3 to embodiment 6, the transmittance is 0%. Therefore, the polyimide films comprising lithium iron phosphate have lower transparency, so that the protection of the circuit diagrams by the polyimide films from being decoded or plagiarized is better. For the 60° glossiness of the polyimide films, the 60° glossiness of embodiment 1 to 6 is less than or equal to 70 GU, so that the reflection of light by the polyimide films is decreased. For embodiment 1 to embodiment 5, the 60° glossiness is less than or equal to 40 GU. For embodiment 2 to embodiment 5, the 60° glossiness is less than or equal to 30 GU. For embodiment 2 to embodiment 4, the 60° glossiness is less than or equal to 25 GU. For embodiment 3 and embodiment 4, the 60° glossiness is less than or equal to 20 GU.

In detail, the polyimide films comprising the lithium iron phosphate are black films, so that the manufactured polyimide films are able to protect the circuit diagrams from being decoded or plagiarized. Also, the polyimide films comprising the lithium iron phosphate include high surface resistance and high volume resistance, so that the polyimide films have better electric insulating properties. On the other hand, the polyimide films comprising the lithium iron phosphate also include high withstanding voltage, so that the polyimide films are able to be manipulated under a higher voltage. Also, the polyimide films comprising the lithium iron phosphate have lower transparency and lower glossiness, so that the protection of the circuit diagrams from being decoded or plagiarized is improved. Furthermore, since the molecular weight of the lithium iron phosphate is greater, the lithium iron phosphate in the polyimide films comprising the lithium iron phosphate is not stimulated and separated out from the polyimide films during surface treatments, such as exposing a plasma or a laser, so that the lithium iron phosphate further causing pollution is avoided.

Please refer to table 2, compositions and results of corresponding analysis of the polyimide films without being added with lithium iron phosphate are presented in Table 2. The thickness of the polyimide films presented are 50 μm.

TABLE 2

| | Comparative examples | |
|---|---|---|
| | 1 | 2 |
| polyamic acid (wt, %) | 100% | 75% |
| lithium iron phosphate (wt, %) | 0 | 0 |
| inorganic particle (wt, %) | 0 | 0 |
| carbon material (wt, %) | 0 | carbon soot 25% |
| thickness of the polyimide film (μm) | 50 | 50 |
| color | orange | black |
| surface resistance (Ω) | $\geq 10^{13}$ | $\geq 10^{13}$ |
| volume resistance (Ω cm) | $\geq 10^{13}$ | $\geq 10^{13}$ |
| withstanding voltage (kV/mil) | 5.5 | 0.2 |
| transmittance (%) | >90 | 0 |
| 60° glossiness (GU) | 100 | 25 |

For comparative example 1, since comparative example 1 does not comprise the lithium iron phosphate, the polyimide film manufactured is orange. Therefore, the polyimide film of comparative example 1 can not protect the circuit diagrams from being decoded or being plagiarized as embodiments of the disclosure, as well as the polyimide film of comparative example 1 is not suitable for being adapted for manufacturing printed circuit boards so as to protect the circuit diagrams. For comparative example 2, the polyimide film is black because carbon soot is added. However, the withstanding voltage of the polyimide film is greatly decreased (0.2 kV/mil). Therefore, the polyimide film is easily crumbled because of the low withstanding voltage, so that the polyimide film is not desirable to be adapted for manufacturing the printed circuit boards. Furthermore, since the molecular weight of carbon soot is small, carbon soot is easily to be stimulated and separated out from the polyimide film during surface treatments, such as exposing plasma or a laser, and carbon soot separated out from the polyimide film further causes pollution.

Figure 2:
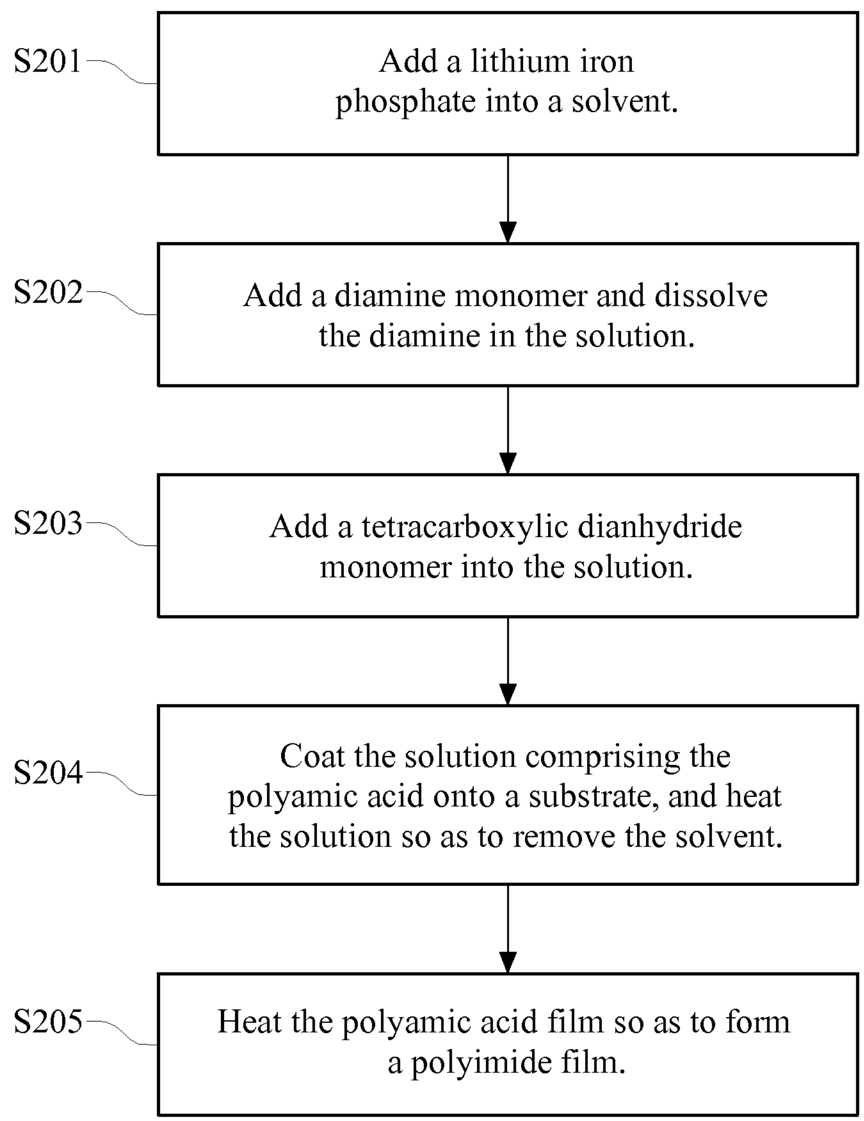
FIG. 2 is a flow chart of a method for manufacturing a polyimide laminate according to an embodiment of the disclosure.
Figure 3:
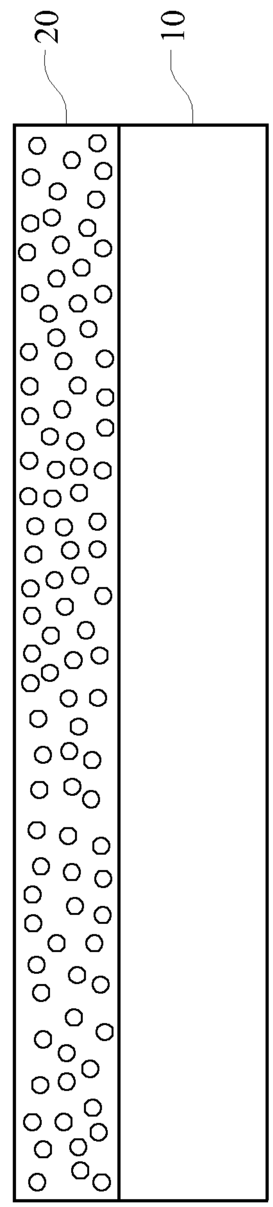
FIG. 3 is a perspective view of the polyimide laminate manufactured.

Next, please refer to FIG. 2 and FIG. 3, FIG. 2 is a flow chart of a method for manufacturing a polyimide laminate according to an embodiment of the disclosure, and FIG. 3 is a perspective view of the polyimide laminate manufactured. Wherein, step S201 to step S203 is similar to step S101 to S103 in FIG. 1, therefore, those steps are not further described.

After the tetracarboxylic dianhydride monomer reacts with the diamine monomer and undergoes the polymerization so as to form the polyamic acid, coat the solution comprising the polyamic acid onto a substrate 10, and heat the solution so as to remove the solvent (S204). Therefore, the polyamic film is formed on the substrate 10. The substrate 10 is, for example, a metallic substrate. The material of the metallic substrate is copper, palladium, aluminum, iron, nickel, or alloy, but the disclosure is not limited thereto. In this embodiment, the material of the metallic substrate is copper, and the drying temperature is between 120° C. and 200° C. In this and other embodiments, the melting temperature of the substrate 10 corresponds to the drying temperature, so that the substrate is not liquefied because the drying temperature is too high.

Finally, heat the polyamic acid film so as to form a polyimide film 20 (S205). In detail, the substrate 10 is placed under a higher temperature, so that the PAA film undergoes imidization so as to form a polyimide film 20 on the surface of the substrate 10, as well as the polyimide film 20 covers the substrate 10. Therefore, the manufacture of the polyimide laminate is accomplished (as FIG. 3). Wherein, the melting temperature of the substrate 10 also corresponds to the reaction temperature of the imidization, so that the substrate is not liquefied because the reaction temperature is too high. Moreover, when coating the solution comprising the PAA on the substrate 10, the solution comprising the PAA is liquid phase so that the solution flows into the intervals of the substrate 10. Therefore, when the polyamic acid forming bonding and transforming to polyamic film, and then transforming to polyimide film 20 during the heating process, the intervals between the polyimide film 20 and the substrate 10 are less, that is, the area the polyimide film 20 touches the substrate 10 is larger. That is, the contact area between the polyimide film 20 and the substrate 10 is greater. Therefore, the adhesive strength between the polyimide film 20 and the substrate 10 is greater because the polyimide film 20 and the substrate 10 attract to each other. In this embodiment, the reaction temperature is between 270° C. and 400° C. Furthermore, the polyimide film 20 is fixed on the substrate 10 (such as copper). In this embodiment, the adhesion strength between the substrate 10 and the polyimide film 20 is greater than or equal to 0.6 kilogram/centimeter (Kg/cm). Therefore, the polyimide film 20 binds to the substrate 10 without adhesives (e.g. flexible copper clad laminates covered with the polyimide film without adhesives), so that the polyimide film 20 separating from the substrate 10 is avoided. Moreover, the process is easier than the process using adhesives, and the affection of the adhesives to the polyimide film 20 (such as physical properties and chemical properties) is avoided.

Please refer to table 3, compositions and results of corresponding analysis of the polyimide laminates manufactured according to FIG. 2 and polyimide laminates without being added with lithium iron phosphate are presented in Table 3.

TABLE 3

| | Embodiment 7 | Embodiment 8 | Embodiment 9 | Embodiment 10 | Comparative example 3 | Comparative example 4 |
|---|---|---|---|---|---|---|
| polyamic acid (wt, %) | 75% | 70% | 65% | 70% | 100% | 75% |
| lithium iron phosphate (wt, %) | 25% | 20% | 20% | 20% | 0 | 0 |
| inorganic particle (wt, %) | 0 | kaolinite 10% | silicon dioxide 10% | titanium dioxide 10% | 0 | 0 |
| carbon material (wt, %) | 0 | 0 | carbon soot 5% | 0 | 0 | carbon soot 25% |
| adhesion strength (kg/cm) | 1.0 | 1.2 | 1.0 | 0.6 | 0.8 | 1.0 |
| dimensional stability (%) | 0.06 | 0.05 | 0.08 | 0.08 | 0.06 | 0.05 |

For embodiment 7 to embodiment 10, the adhesion strength of the manufactured polyimide laminate is greater than or equal to 0.6 kg/cm. The testing method is IPC-TM-650; Method 2.4.9. For embodiment 7 to embodiment 9, the adhesion strength of the manufactured polyimide laminate is greater than or equal to 1.0 kg/cm. For embodiment 8, the adhesion strength of the manufactured polyimide laminate is 1.2 kg/cm. Furthermore, for embodiment 7 to embodiment 10, the dimensional stability of the manufactured polyimide laminate is less than or equal to 0.08%. The testing method is IPC-TM-650; Method 2.2.4. For embodiment 7 and embodiment 8, the dimensional stability of the manufactured polyimide laminate is less than or equal to 0.06%. For embodiment 8, the dimensional stability of the manufactured polyimide laminate is less than or equal to 0.05%. Wherein, the dimensional stability presents the ratio of the variations of the size of the polyimide laminate during the working process. Since the dimensional stability of the polyimide laminate of the disclosure is less than or equal to 0.08%, the size variation of the polyimide laminate is less during further working processes, so that it is easier for further working processes.

According to the embodiments of the disclosure, the polyimide films comprise lithium iron phosphate, so that the polyimide films and the manufactured polyimide laminates are black. Therefore, the polyimide films cover and protect the circuit diagrams on the substrate, so that the problems met in the previous polyimide films that the circuit diagrams are easily decoded according to the transparency of the polyimide films are solved.

Moreover, in some embodiments, the polyimide films manufactured and the polyimide laminates thereof have higher withstanding voltage because the polyimide films comprise lithium iron phosphate. Therefore, the problem that the polyimide films are crumbled because of applying electricity is solved.

Furthermore, in some embodiments, the polyimide films comprise carbon materials so that the polyimide films are blacker, and protection of the polyimide films from being decoded or being plagiarized is improved.

Moreover, in some embodiments, the transparency of the polyimide films is further lowered because the polyimide comprises inorganic particles, so that the protection of the circuit diagrams from being decoded or plagiarized is improved. Also, the glossiness of the polyimide films is lowered, light scattering is less, and the quality is improved.

What is claimed is:

1. A polyimide film, comprising:
a polyimide; and
a lithium iron phosphate, the weight percentage of the lithium iron phosphate being between 1 wt % and 49 wt %, and the weight percentage of the lithium iron phosphate being based on the total weight of the polyimide film;
wherein, the transmittance of the polyimide film is less than or equal to 20%.

2. The polyimide film according to claim 1, wherein the weight percentage of the lithium iron phosphate is between 5 wt % and 35 wt %.

3. The polyimide film according to claim 2, wherein the weight percentage of the lithium iron phosphate is between 10 wt % and 30 wt %.

4. The polyimide film according to claim 1, wherein the diameter of the lithium iron phosphate is between 0.1 micrometer and 10 micrometers.

5. The polyimide film according to claim 1, wherein the diameter of the lithium iron phosphate is between 0.5 micrometer and 6 micrometers.

6. The polyimide film according to claim 1, further comprising a carbon material, the carbon material being carbon soot, carbon ash, graphite, carbon capsule, carbon nanotube, graphene, or the combination thereof.

7. The polyimide film according to claim 1, further comprising an inorganic particle, the inorganic particles being mica powder, silicon dioxide powder, talc powder, ceramic powder, clay powder, titanium dioxide, kaolinite, sintered silica gel powder, silicon carbide, barium sulfate, boron nitride, aluminum oxide, aluminum nitride, or the combination thereof.

8. The polyimide film according to claim 1, wherein the thickness of the polyimide film is between 12 micrometers and 250 micrometers.

9. The polyimide film according to claim 1, wherein a 60° glossiness of the polyimide film is less than or equal to 70 GU.

10. A polyimide laminate, comprising:

a substrate; and a polyimide film according to claim 1, the polyimide film covering the substrate.

11. The polyimide laminate according to claim 10, wherein the substrate is a metallic substrate.

12. The polyimide laminate according to claim 10, wherein the material of the metallic substrate is copper, palladium, aluminum, iron, nickel, or alloy.

13. The polyimide laminate according to claim 10, wherein an adhesion strength of the substrate with the polyimide film is greater than or equal to 0.6 Kg/cm.

14. A polyimide film, comprising:

a polyimide; and a lithium iron phosphate, the weight percentage of the lithium iron phosphate being between 1 wt % and 49 wt %, and the weight percentage of the lithium iron phosphate being based on the total weight of the polyimide film;

wherein, the withstanding voltage of the polyimide film is greater than or equal to 1.2 KV/mil.

15. The polyimide film according to claim 14, wherein the weight percentage of the lithium iron phosphate is between 5 wt % and 35 wt %.

16. The polyimide film according to claim 15, wherein the weight percentage of the lithium iron phosphate is between 10 wt % and 30 wt %.

17. The polyimide film according to claim 14, wherein the diameter of the lithium iron phosphate is between 0.1 micrometer and 10 micrometers.

18. The polyimide film according to claim 14, wherein the diameter of the lithium iron phosphate is between 0.5 micrometer and 6 micrometers.

19. The polyimide film according to claim 14, further comprising a carbon material, the carbon material being carbon soot, carbon ash, graphite, carbon capsule, carbon nanotube, graphene, or the combination thereof.

20. The polyimide film according to claim 14, further comprising an inorganic particle, the inorganic particles being mica powder, silicon dioxide powder, talc powder, ceramic powder, clay powder, titanium dioxide, kaolinite, sintered silica gel powder, silicon carbide, barium sulfate, boron nitride, aluminum oxide, aluminum nitride, or the combination thereof.

21. The polyimide film according to claim 14, wherein the thickness of the polyimide film is between 12 micrometers and 250 micrometers.

22. The polyimide film according to claim 14, wherein a 60° glossiness of the polyimide film is less than or equal to 70 GU.

23. A polyimide laminate, comprising:

a substrate; and a polyimide film according to claim 14, the polyimide film covering the substrate.

24. The polyimide laminate according to claim 23, wherein the substrate is a metallic substrate.

25. The polyimide laminate according to claim 23, wherein the material of the metallic substrate is copper, palladium, aluminum, iron, nickel, or alloy.

26. The polyimide laminate according to claim 23, wherein the adhesion strength of the substrate with the polyimide film is greater than or equal to 0.6 Kg/cm.

* * * * *